United States Patent [19]

Ito

[11] Patent Number: 5,229,256
[45] Date of Patent: Jul. 20, 1993

[54] PROCESS FOR GENERATING POSITIVE-TONE PHOTORESIST IMAGE

[75] Inventor: Hiroshi Ito, San Jose, Calif.

[73] Assignee: International Business Machines Corporation, Armonk, N.Y.

[21] Appl. No.: 804,148

[22] Filed: Dec. 6, 1991

[51] Int. Cl.$^5$ .................................................. G03C 5/00
[52] U.S. Cl. ..................................... 430/311; 430/325; 430/328; 430/330; 430/394; 156/643; 156/646
[58] Field of Search ............... 430/311, 313, 314, 325, 430/328, 330, 394; 156/643, 644, 646, 659.1, 660

[56] References Cited

U.S. PATENT DOCUMENTS

| 4,491,628 | 1/1985 | Ito et al. | 430/176 |
|---|---|---|---|
| 4,552,833 | 11/1985 | Ito et al. | 430/325 |
| 4,613,398 | 9/1986 | Chiong et al. | 156/628 |
| 4,657,845 | 4/1987 | Frechet et al. | 430/326 |
| 4,810,601 | 3/1989 | Allen et al. | 430/18 |
| 5,037,721 | 8/1991 | Doessel | 430/176 |

OTHER PUBLICATIONS

Ito et al., "Thermolysis and Photochemical Acidolysis of Selected Polymethacrylates", American Chem. Soc., 1988.

Coopmans et al., "DESIRE: A Novel Dry Developed Resist System", SPIE vol. 631, Advances in Resist Technology and Processing III (1986).

Meyer et al., "Plasma Developable Positive UV-Resisto", Elevier Science Publishers, B. V. (North-Holland), 1983.

Ito et al., "Thermally Developable, Positive Tone, Oxygen RIE Barrier Resist for Bilayer Lithography, IBM Research Division", Almaden Research Center, San Jose, Calif., 1989, pp. 245-249.

Ito et al., "Highly Sensitive Thermally Developable Positive Resist Systems", IBM Research Division, Almaden Research Center, San Jose, Calif., 1988, pp 2259-2263.

Primary Examiner—Marion E. McCamish
Assistant Examiner—Kathleen Duda
Attorney, Agent, or Firm—Robert B. Martin

[57] ABSTRACT

The present invention relates to a multistep process for generating a positive tone photoresist image with dry development.

5 Claims, No Drawings

PROCESS FOR GENERATING POSITIVE-TONE PHOTORESIST IMAGE

Field of the Invention

The present invention relates to a process for generating a positive tone photoresist image with dry development.

BACKGROUND OF THE INVENTION

Lithographic techniques are well known in the art for forming precise circuit patterns on substrates in the fabrication of integrated circuits. Lithographic techniques have been used to form both positive and negative tone photoresist images. However, those skilled in the art generally prefer positive tone images because of processing advantages. For example, in electron beam direct write lithography, positive tone images generally require less writing. In optical lithography, most of the area of a positive tone mask will be composed of metal and therefore the mask will be less likely to be effected by opaque airborne contaminates which land on the mask during operation. Positive resists are also preferred in the fabrication of contact holes.

The diazonaphthoquinone/novalac positive tone, wet developed resist system is widely used in the industry. However, the wet development of the resist results in isotropic images which contribute to resolution problems especially with decreasing feature size.

In order to overcome the isotropic development problem, there is a desire to discover an effective dry developed positive tone resist system. Ito et al., U.S. Pat. No. 4,657,845 "Positive Tone Oxygen Plasma Developable Photoresist", issued Apr. 14, 1987, disclose a positive tone, dry developed resist system. The system involves the use of methyl isocyanate and is not widely used.

Ito et al., "Highly Sensitive Thermally Developable Resist System" J. Vac. Sci. Technol. B6(6) November/December 1988 p. 2259, disclose a bilayer, dry developed, positive tone resist system. Bilayer resist systems require additional processing steps resulting in increased process complexity and cost. Therefore, there is a continuing need in the art for a dry developed, positive tone resist system.

It is therefore an object of the present invention to provide a process for generating a positive tone, dry developed, resist image for use in making integrated circuits.

Other objects and advantages will become apparent from the following disclosure.

SUMMARY OF THE INVENTION

The present invention relates to a process for generating a dry developed positive tone photoresist image comprising the steps of:
(a) forming a film of polyacrylate and a photosensitive acid generator on a substrate;
(b) imagewise exposing the film to radiation to cause imagewise conversion of polyacrylate to poly(acrylic acid);
(c) heating the film to an elevated temperature to cause conversion of the imaged poly(acrylic acid) to imaged poly(acrylic anhydride);
(d) flood exposing the film to radiation to cause conversion of the remaining polyacrylate to remaining poly(acrylic acid);
(e) contacting said film with an organometallic compound to form an etch barrier with the remaining poly(acrylic acid); and
(f) etching the film with reactive ions to form the positive tone photoresist image.

The present invention also relates to an integrated circuit made by the process of the present invention.

A more thorough disclosure of the present invention is presented in the detail description which follows.

DETAILED DESCRIPTION OF THE INVENTION

The first step of the process of the present invention involves forming a film of polyacrylate and a photosensitive acid generator on a substrate. As used herein the prefix polyacryl- in polyacrylate will mean:

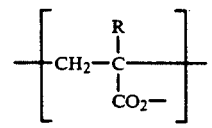

where R is hydrido or methyl.

Suitable polyacrylates for use in the process of the present invention will have a molecular weight of about 5,000 to about 100,000. Suitable polyacrylates are commercially available or readily prepared by standard synthetic techniques.

Suitable alkyl ester substituents for the polyacrylate include (i) secondary and tertiary alkyl substituents such as isopropyl, s-butyl, t-butyl, and the like which can optionally be substituted with a phenyl group and (ii) aromatic substitutes such as a α-methylbenzyl. Preferred substituents include t-butyl, α-methylbenzyl. It is important that the polyacrylate ester be thermally stable against deesterification at the temperature where the poly(acrylic acid) is converted into poly(acrylic anhydride) and certain sterically hindered ester substituents may be unsuitable such as α,α-dimethylbenzyl and 2-cyclopropyl-2-propyl.

Suitable photosensitive acid generators for use in the process of the present invention are onium salts. Suitable onium salts include unsubstituted and symmetrically or unsymmetrically substituted diaryliodium, triaylsulfonium, and triarylselenonium. Suitable specific photoacid generators are triphenylsulfonium hexafluoroarsenate diphenyliodonium hexafluoroarsenate and triflate. Other suitable photoacid generators will be known to those skilled in the art.

To coat the polymer and photosensitive acid generator on a substrate, they are first conveniently dissolved in a suitable solvent such as methyl cellosolve acetate, cyclohexanone, propylene glycol monomethyl ether acetate, or ethyl lactate. The film can then be coated on the substrate using art known techniques such as spin or spray coating, or doctor blading. Suitable substrates include silicon, silicon oxide, silicon nitride or gallium arsenide. After forming the film on the substrate, the film may optionally be baked at a low temperature for a short period of time to drive off the casting solvent.

In order to avoid radiation backscattering during exposure, the film may also comprise an aromatic dye. The dye functions to absorb substantially all imaging radiation in the film (e.g. greater than about 95%) before it hits the substrate to prevent backscattering of radiation from the topographical features of the substrate. Such backscattering is a significant contribution to linewidth variation and resolution problems.

Suitable classes of dyes are aromatic compounds and other compounds having large absorption coefficients at the imaging wavelength. Suitable classes of dyes include fluorenes, nitrostilbenes, biphenyls, furans, thiazines and anthracenes and derivatives thereof. Suitable dyes include anthracene and phenothiazine. The optimum dye will generally have a large absorption coefficient at the wavelength(s) of the imagings radiation. Further the dye will be soluble in the organic solvent used to coat the film onto the substrate. The dye should be sufficiently soluble in the solvent/resist mixture so that high absorption is obtained for the resist film. The dye should not interfere with the process of the present invention nor adversely effect the final properties of the resist. The dye can also function as a photosensitizer for the photoacid generator.

The second step of the process of the present invention involves imagewise exposing the film to radiation to cause generation of free acid in the exposed areas of the film from the photosensitive acid generator.

Suitable radiation sources include electron beam, x-ray and various arc lamps as mercury, deuterium or excimer laser source. The free acid deesterifies the poly(acrylic ester) to form the corresponding poly(acrylic acid) in the exposed areas of the film. Preferably, the film is heated to an elevated temperature about 80°–150° C. for a short period of time to accelerate the deesterification reaction.

The third step of the process of the present invention involves heating the film to an elevated temperature for short period of time to cause dehydration of most of the poly(acrylic acid) to form poly(acrylic anhydride). Preferrably, the film is heated to a temperature of about 160° C. and more preferably about 180° C. for about 5 to 30 minutes. Higher temperatures and longer heating times can cause deesterification of the remaining polyacrylate in the film.

In the fourth step of the process of the present invention the film is flood exposed to cause conversion of the remaining poly(acrylic ester) to poly(acrylic acid). The film now comprises poly(acrylic acid) with imaged areas comprising poly(acrylic anhydride) and poly(acrylic acid).

In the fifth step of the process of the present invention, the film is contacted with an organometallic compound disposed in the gas phase or in solution. Preferred metallic portions of the organometallic compound comprise silicon, tin, germanium and titanium. Preferred organometallic compounds are organosilicon and organostannyl compounds including, for example, dimethylaminotrimethylsilane, hexamethyldisilazane, trimethylsilyl chloride, trimethylstannyl chloride, dimethylstannyl chloride, and 1,1,3,3,5,5 hexamethylcyclotrisilazane. Other suitable organometallic compounds will be known to those skilled in the art.

The acid functionality in the poly(acrylic acid) will react with the organometallic compound to form a material which is resistant to oxygen reactive ion etching. The poly(acrylic anhydride) in the film does not react with the organometallic compound and these portions of the film (the imaged portions) are susceptible to reactive ion etching.

The last step of the process of the present invention involves etching the film with reactive ions to yield development in the dry state. As used herein, etching with oxygen reactive ions will include plasma etching and reactive ion etching. Etching techniques ar well known in the art and equipment is commercially available to etch film in the dry state. Development of the film results in the removal of the poly(acrylic anhydride) and exposure of the substrate in imaged portions of the film to form a positive tone resist image. The resist image is sharp and without any debris on the substrate surface.

The present invention also relates to an integrated circuit such as an integrated circuit chip or multichip module comprising a circuit made by the steps of:
(a) forming a film of polyacrylate and a photosensitive acid generator on a substrate;
(b) imagewise exposing the film to radiation to cause imagewise conversion of polyacrylate to poly(acrylic acid);
(c) heating the film to an elevated temperature to cause conversion of imaged poly(acrylic acid) to imaged poly(acrylic anhydride);
(d) flood exposing the film to radiation to cause conversion of the remaining polyacrylate to remaining poly(acylic acid);
(e) contacting said film with an organometallic compound to form an etch barrier with the remaining poly(acrylic acid);
(f) etching the film with reactive ions to develop the positive tone resist image; and
(g) forming the circuit in the developed film on or in the substrate by art known techniques.

After the substrate has been exposed by development, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transistors. Alternatively, the exposed substrate can be etched to form a trench capacitor or a p-n junction diode by art known techniques. Other means for forming circuits will be known by those skilled in the art.

The following examples are detailed descriptions of methods of preparation and process of the present invention. The detailed preparations and process description fall within the scope of, and serve to exemplify, the more generally described methods and process description set forth above. The examples are presented for illustrative purposes only, and are not intended as a restriction on the scope of the invention.

EXAMPLE I

Poly(t-butyl methacrylate) ($M_n = 30,000$) was dissolved in cyclohexanone at a weight ratio of one to five. To this solution was added 9.6 wt % of triphenylsulfonium hexafluoroarsenate.

After filtration, a 1.4 μm thick resist film was formed on a silicon wafer by spincoating at (3000 rpm for 30 seconds) and subsequently heating at 100° C. for 10 minutes.

The film was imagewise exposed to 20 millijoules/cm$^2$ of 254 nm radiation. The film was then heated to 100° C. for 2 minutes and then heated to 180° C. for 5 minutes to convert poly(methacrylic acid) to poly(methacrylic anhydride).

The film was then flood exposed to 136 mJ/cm$^2$ of 254 nm radiation and heated for 2 minutes at 100° C.

The film was then silylated with dimethylaminotrimethylsilane (220 torr at 105° C. for 5 minutes). The silylated film was contacted with oxygen reactive ions (oxygen 40 sccm, 150 w, −240 v) at 30 mtorr for 13 minutes to form a positive tone resist image without any debris on the substrate.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A process for generating a positive resist image comprising the steps of:
   (a) forming a film of polyacrylate and a photosensitive acid generator on a substrate;
   (b) imagewise exposing the film to radiation to cause imagewise conversion of polyacrylate to poly(acrylic acid);
   (c) heating the film to an elevated temperature to cause conversion of the imaged poly(acrylic acid) to imaged poly(acrylic anhydride);
   (d) flood exposing the film to radiation to cause conversion of the remaining polyacrylate to remaining poly(acrylic acid);
   (e) contacting said film with an organometallic compound to form an etch barrier with the remaining poly(acrylic acid); and
   (f) etching the film with reactive ions to form the positive resist image.

2. The process of claim 1 wherein the photosensitive acid generator is triphenylsulfonium hexafluoroarsenate, diphenyliodium hexafluoroarsenate or triflate.

3. The process of claim 1 wherein said film further comprises an aromatic dye.

4. The process of claim 3 wherein said dye is anthracene or phenothiazine.

5. The process of claim 1 wherein said organometallic compound is dimethylaminotrimethylsilane.

* * * * *